United States Patent
Liu et al.

(10) Patent No.: US 7,508,576 B2
(45) Date of Patent: Mar. 24, 2009

(54) DIGITAL SIGNAL REGENERATION, RESHAPING AND WAVELENGTH CONVERSION USING AN OPTICAL BISTABLE SILICON RAMAN LASER

(75) Inventors: Ansheng Liu, Cupertino, CA (US); Mario J. Paniccia, Santa Clara, CA (US)

(73) Assignee: Intel Corporation, Santa Clara, CA (US)

( * ) Notice: Subject to any disclaimer, the term of this patent is extended or adjusted under 35 U.S.C. 154(b) by 406 days.

(21) Appl. No.: 11/040,238

(22) Filed: Jan. 20, 2005

(65) Prior Publication Data

US 2006/0159131 A1    Jul. 20, 2006

(51) Int. Cl.
    $H01S\ 3/00$    (2006.01)
(52) U.S. Cl. .................... 359/334; 359/344; 359/346
(58) Field of Classification Search .......... 359/334, 359/344, 346
    See application file for complete search history.

(56) References Cited

U.S. PATENT DOCUMENTS

| 4,812,776 | A | 3/1989 | Sasaki |
| 6,608,846 | B1 | 8/2003 | Fischer et al. |
| 6,888,667 | B2 * | 5/2005 | Nicolaescu ............ 359/332 |
| 2004/0090661 | A1 | 5/2004 | Nicolaescu |
| 2006/0050368 | A1 * | 3/2006 | Chung et al. ............ 359/344 |

FOREIGN PATENT DOCUMENTS

| JP | 09-148661 | 6/1997 |
| TW | 388869 | 5/2000 |
| TW | 453086 | 9/2001 |
| WO | PCT/US2006/000479 | 6/2006 |

OTHER PUBLICATIONS

Suto K. et al., "Characteristics of the epitaxial semiconductor Raman laser," IEE Proceedings, vol. 133, No. 4, pp. 259-263, Aug. 1986.
Garmire E., "Criteria for Optical Bistability in a Lossy Saturating Fabry-Perot," IEEE Journal of Quantum Electronics, vol. 25, No. 3, pp. 289-295, Mar. 1989.
Okuda M. et al., "Bistability of Optical Resonator with Distributed Bragg-Reflectors by Using the Kerr Effect," Japanese Journal of Applied Physics Japan, vol. 16, No. 5, pp. 769-773, May 1977.
PCT/US2006/00479—International Preliminary Report on Patentability, dated Jul. 24, 2007.
Jones, Richard, et al., "Net Continuous Wave Optical Gain in a Low Loss Silicon-On-Insulator Waveguide by Stimulated Raman Scattering," Optical Society of America, 2004, pp. 1-8.

* cited by examiner

*Primary Examiner*—Mark Hellner
(74) *Attorney, Agent, or Firm*—Blakely, Sokoloff, Taylor & Zafman LLP

(57) ABSTRACT

An optical bistable silicon Raman laser is disclosed, which provides digital signal regeneration, reshaping and wavelength conversion. An apparatus according to aspects of the present invention includes an optical waveguide disposed in semiconductor material. First and second reflectors are disposed in the optical waveguide. The first and second reflectors define a cavity in the optical waveguide. The cavity is to receive a first optical beam having a first wavelength. A power level of the first optical beam received by the cavity rising above a second power level results in emission of a second optical beam of a second wavelength from the cavity until the power level of the first optical beam received by the cavity falls below a first power level. The first power level is less than the second power level.

21 Claims, 4 Drawing Sheets

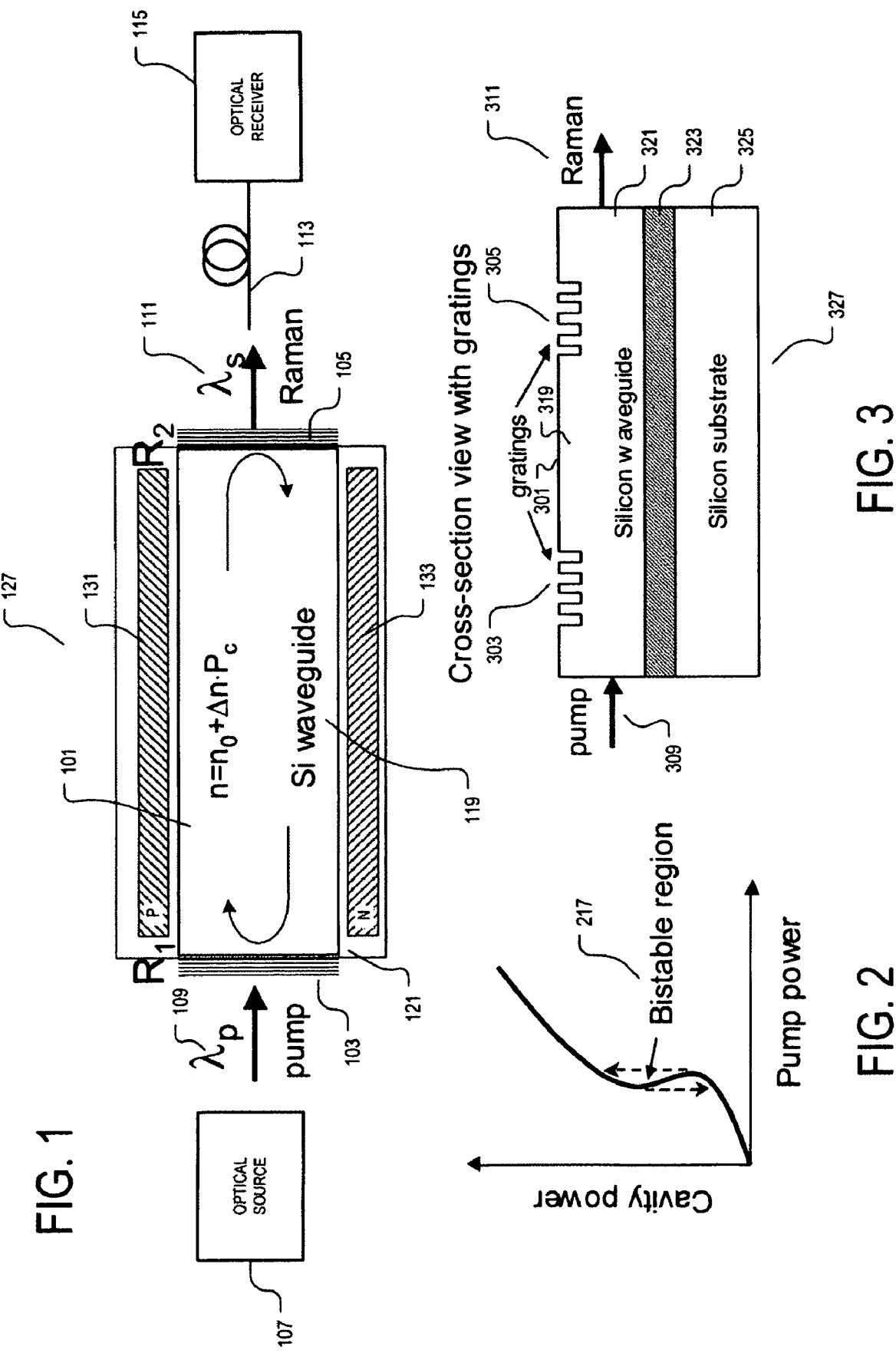

DIGITAL SIGNAL REGENERATION, RESHAPING AND WAVELENGTH CONVERSION USING AN OPTICAL BISTABLE SILICON RAMAN LASER

BACKGROUND OF THE INVENTION

1. Field of the Invention

Embodiments of invention relate generally to optical devices and, more specifically but not exclusively relate to optical signal regeneration, reshaping and wavelength conversion.

2. Background Information

The need for fast and efficient optical-based technologies is increasing as Internet data traffic growth rate is overtaking voice traffic pushing the need for fiber optical communications. Transmission of multiple optical channels over the same fiber in the dense wavelength-division multiplexing (DWDM) system provides a simple way to use the unprecedented capacity (signal bandwidth) offered by fiber optics. Commonly used optical components in the system include wavelength division multiplexed (WDM) transmitters and receivers, optical filter such as diffraction gratings, thin-film filters, fiber Bragg gratings, arrayed-waveguide gratings, optical add/drop multiplexers, lasers and optical switches. Optical switches may be used to modulate optical beams.

All-optical signal regeneration and wavelength conversion are promising functions for future optical communication networks. Since all optical switching nodes are expected to degrade optical signals, signal reamplification, regeneration, and reshaping (3R) devices would be helpful for a better system performance. In addition, wavelength conversion would also be helpful for future high-speed optical switching fabrics using wavelength routing.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

FIG. 1 is a block diagram illustrating one embodiment of a system including one embodiment of a bistable silicon Raman laser in accordance with the teachings of the present invention.

FIG. 2 is a diagram illustrating a bistable region in a relationship between cavity power and pump power according to an embodiment of the present invention.

FIG. 3 is a block diagram illustrating one embodiment of a bistable silicon Raman laser with gratings on a silicon-on-insulator wafer in accordance with the teachings of the present invention.

DETAILED DESCRIPTION

Figure 5:
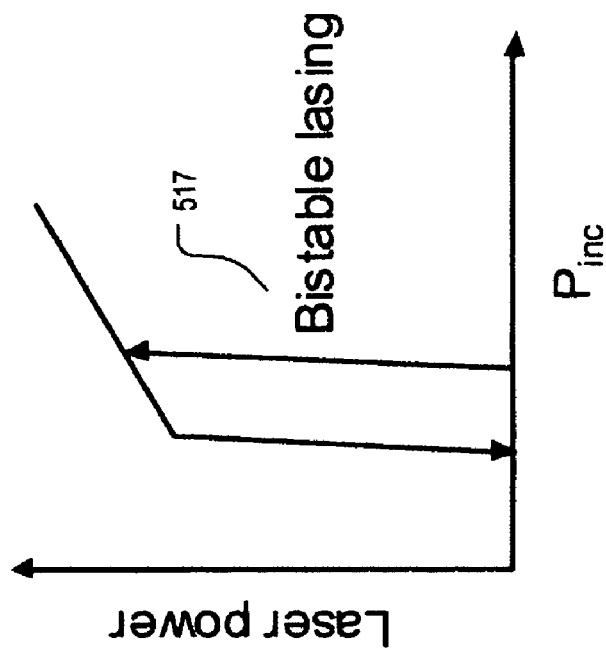
FIG. 5 is a diagram illustrating the hysteretic relationship of the bistable lasing in an embodiment of a bistable silicon Raman laser in accordance with the teachings of the present invention.

Methods and apparatuses for digital signal regeneration, reshaping, and wavelength conversion using a bistable silicon Raman laser are disclosed. In the following description numerous specific details are set forth in order to provide a thorough understanding of the present invention. It will be apparent, however, to one having ordinary skill in the art that the specific detail need not be employed to practice the present invention. In other instances, well-known materials or methods have not been described in detail in order to avoid obscuring the present invention.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment. Furthermore, the particular features, structures or characteristics may be combined in any suitable manner in one or more embodiments. In addition, it is appreciated that the figures provided herewith are for explanation purposes to persons ordinarily skilled in the art and that the drawings are not necessarily drawn to scale.

FIG. 1 shows an embodiment of a silicon Raman laser 127 in accordance with the teachings of the present invention. As illustrated, laser 127 includes an optical waveguide 101 disposed in semiconductor material 121. In one embodiment, the semiconductor material 121 includes silicon. In the illustrated embodiment, first and second reflectors 103 and 105 are disposed in the optical waveguide 101. The first and second reflectors 103 and 105 define a cavity 119 in the optical waveguide 101. In one embodiment, optical waveguide 101 is a low loss silicon waveguide and first and second reflectors 103 and 105 are multi-layer coatings or waveguide based gratings that reflect first and second wavelengths $\lambda_P$ and $\lambda_S$. In one embodiment, first and second reflectors 103 and 105 include sampled gratings to reflect $\lambda_P$ and $\lambda_S$. In one embodiment, the reflectivities of first and second reflectors 103 and 105 are $R_1$ and $R_2$, respectively.

In one embodiment, a diode structure including a P region 131 and an N region 133 is disposed in optical waveguide 101. In one embodiment, the diode structure is a PIN diode with P doped silicon in P region 131, intrinsic silicon utilized in the semiconductor material 121, and N doped silicon on N region 133. In one embodiment, the cavity 119 of optical waveguide 101 is substantially defined in the intrinsic silicon region of the diode structure. In one embodiment, P region 131 and N region 133 are coupled to a voltage source to be reversed biased to create an electric field to sweep out free carriers generated in optical waveguide 101 as a result of two-photon absorption occurring in optical waveguide 101. By sweeping away the free carriers, optical losses in optical waveguide 101 may be reduced in accordance with the teachings of the present invention.

In one embodiment, the cavity 119 is optically coupled to receive a first optical beam 109 from an optical source 107. In one embodiment, optical beam 109 has a first wavelength $\lambda_P$ and may be considered a pump beam. As will be discussed, when an optical power level of the first optical beam 109 received by the cavity 119 rises above a second power level, a second optical beam 111 having a second wavelength $\lambda_S$ is emitted from the cavity 119 until the power level of the first optical beam 109 falls below a first power level. As will also be discussed, this first power level is less than the second power level such that the second optical beam 111 is hysteretically generated from cavity 119 in response to the first optical beam 109 in accordance with the teachings of the present invention. In one embodiment, an optical receiver 115 receives the second optical beam 111 from cavity 119. In one embodiment, optical beam 111 is directed from cavity 119 through an optical fiber 113 to optical receiver 115.

In one embodiment, first optical beam 109 is an optical pump signal for use in generating spontaneous Raman scattering and amplifying the Raman signal of a selected frequency via stimulated Raman scattering (SRS) in accordance with the teachings of the present invention. In particular, when SRS occurs in the medium or silicon of an embodiment of optical waveguide 101, some of the energy of the pump signal is converted to light of a different frequency. This difference or shift in frequency is called the Raman frequency shift. In the illustrated embodiment, when the power level of optical beam 109 is sufficient, there is an emission of optical beam 111 having a wavelength $\lambda_S$ from cavity 119 in accordance with the teachings of the present invention.

A value for the SRS gain coefficient for a material pumped at a wavelength $\lambda_P$ can be found by Equation 1:

$$g = 16\pi^3 C^2 S/(\hbar\omega_s^3 n_s^2 (N_0+1)\Gamma) \qquad \text{(Equation 1)}$$

where S is the spontaneous Raman scattering coefficient (proportional to $\omega_s^4$), h is Planck's constant, $n_s$ is the refractive index of the waveguide core material at the Stoke's frequency, $\omega_s$ is the angular frequency of the Stokes emission, $N_0$ is the Bose factor and $\Gamma$ is one half the full width at half maximum of the Stokes line (in units of angular frequency). Equation 1 (due to the $\omega_s^4$ factor of S) shows that the gain coefficient is linearly dependent on the Stokes angular frequency.

In one embodiment, the wavelength $\lambda_S$ of optical beam 111 corresponds to a frequency substantially equal to the first order Stokes frequency of optical beam 109 in accordance with the teachings of the present invention. In an embodiment with the semiconductor material 121 of optical waveguide 101 being silicon, the wavelength $\lambda_P$ is approximately 1550 nm. In this embodiment, the Stokes frequency is 15.6 THz below the pump frequency of optical beam 109 such that the wavelength $\lambda_S$ of optical beam 111 is approximately 1686 nm. With the circulation of optical beam 109 with the wavelength $\lambda_P$ between reflectors 103 and 105, lasing occurs in cavity 119 with the semiconductor material 121 or silicon of optical waveguide 101 functioning as a lasing medium stimulating the emission of optical beam 111. As a result, second optical beam 111 is reamplified within cavity 119 and a leaked portion of second optical beam 111 is output from cavity 119 as shown in accordance with the teachings of the present invention. Therefore, optical beam 109 can be considered as a pump beam to induce Raman gain in cavity 119 in optical waveguide 101 and produces light reamplification at $\lambda_S$ when optical beam 109 has sufficient power in accordance with the teachings of the present invention. In some instances, the gain of the reamplification in silicon Raman laser 127 may be less than, equal to or greater than one in accordance with the teachings of the present invention.

With the reflections of first and second reflectors 103 and 105, the circulating power inside the cavity 119 is significantly different from the incident power of first optical beam 109 in accordance with the teachings of the present invention. If there is a refractive index change $\Delta n$ in the silicon of optical waveguide 101 responding to the optical power inside the cavity 119, a phase shift $\phi$ is induced by the pump beam or optical beam 109. The phase shift $\phi$ in turn further varies the power inside the cavity 119. As a result, an optical bistability effect occurs for the pump beam or optical beam 109 in accordance with the teachings of the present invention.

Thus, optical bistable operation results in cavity 119, which results in a bistable silicon Raman laser 127 according to embodiments of the present invention if there is a bistable response for the pump beam or first optical beam 109. The optical bistability can be analyzed with the following set of equations:

$$P_c = \frac{(1-R_1)(1+R_2 e^{-\alpha L})(1-e^{\alpha L})}{\alpha L(1-R_e)^2} \cdot \frac{P_{inc}}{1+F\sin^2\phi} \qquad \text{(Equation 2)}$$

$$R_e = \sqrt{R_1 R_2} e^{-\alpha L} \qquad \text{(Equation 3)}$$

$$F = \frac{4R_e}{(1-R_e)^2} \qquad \text{(Equation 4)}$$

$$\phi = \frac{2\pi}{\lambda_p}(n_0 + \Delta n \cdot P_c)L \qquad \text{(Equation 5)}$$

In equations above, $P_c$ is the effective mean internal power inside the cavity, $P_{inc}$ is the incident pump power of optical beam 109, $\alpha$ is the waveguide loss in optical waveguide 101, L is the cavity length of cavity 119, $n_0$ is the effective index of the silicon waveguide at lower power, and $\Delta n$ is the nonlinear refractive index change, which is related to Kerr effects (third order nonlinear effect) of silicon. From Equations 2-5, we can obtain the cavity power ($P_c$) as a function of incident power.

FIG. 2 is a diagram illustrating a bistable region in a relationship between cavity power and pump power according to an embodiment of the present invention. Bistable region 217 of FIG. 2 shows schematically the "S-shaped" cavity power vs. the incident power exhibiting optical bistability in accordance with the teachings of the present invention. This results in the hysteretic emission of the Raman optical beam wavelength $\lambda_s$ in response to the optical power of the pump optical beam in accordance with the teachings of the present invention.

To illustrate, another embodiment of a bistable silicon Raman laser 327 according to embodiments of the present invention is illustrated in FIG. 3. In the illustrated embodiment, a silicon-on-insulator (SOI) wafer is shown including a silicon substrate 325, with a buried oxide layer 323 and a silicon optical waveguide 301 disposed in semiconductor material 321 of the SOI wafer. In the illustrated embodiment, reflectors 303 and 305 are gratings formed in optical waveguide 301, which define a cavity 319 in optical waveguide 301 between reflectors 303 and 305. In one embodiment, reflectors 303 and 305 are sampled gratings and reflect wavelengths $\lambda_P$ and $\lambda_S$. A pump optical beam 309 is directed into cavity 319 and a Raman optical beam 311 is hysteretically emitted from cavity 319 in response to the power of optical beam 309 in accordance with the teachings of the present invention.

Figure 4:
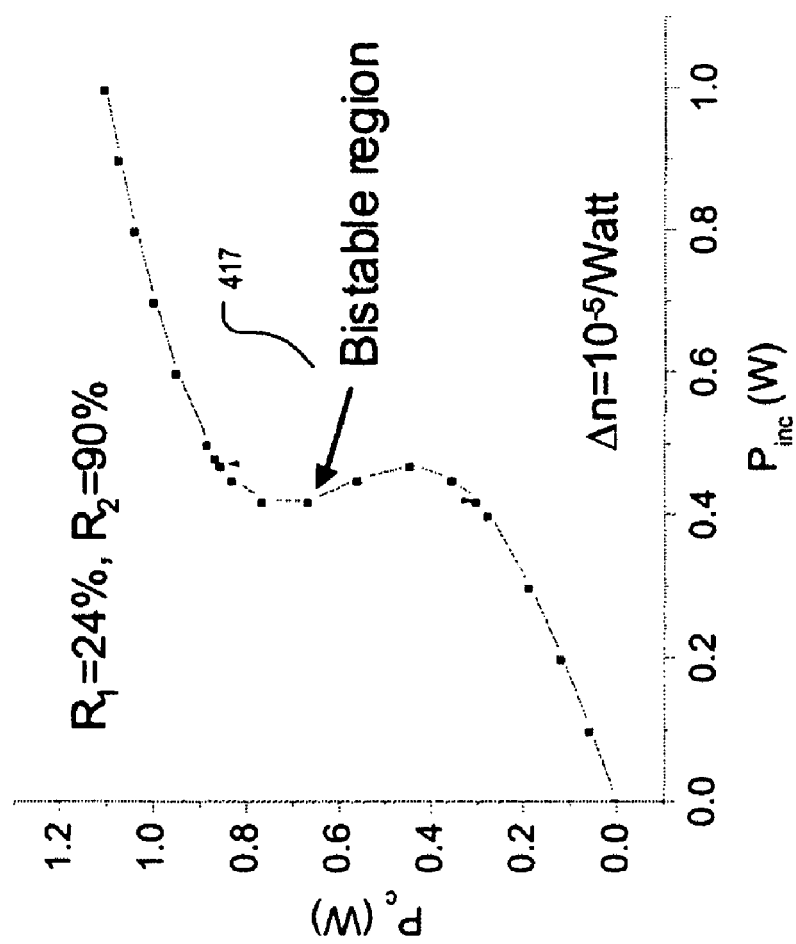
FIG. 4 is a diagram illustrating another embodiment of a bistable region in a relationship between cavity power and pump power in an embodiment of a bistable silicon Raman laser in accordance with the teachings of the present invention.

Directing attention to FIG. 4, a diagram illustrating further detail of the bistable region in the relationship between cavity power and pump power according to an embodiment of a bistable silicon Raman laser is shown. In the illustrated example, the optical power inside a cavity is shown as a function of incident power. In the illustrated example, a 4.8 cm long waveguide is utilized with the reflectivities of $R_1$ and $R_2$ for the reflectors defining the cavity being $R_1$=24% and $R_2$=90%. In the illustrated embodiment, a nonlinear refractive index coefficient of $\Delta n=10^{-5}$/Watt is shown. As can be observed, there is a bistable region 417 for incident pump power from approximately 420 mW to approximately 460 mW in the illustrated example. Thus, in this bistable region 417, a bistable lasing characteristics from the silicon Raman laser are observed with the Raman laser output is directly related to the cavity power, as shown in the bistable region 517 of FIG. 5. Therefore, the lasing of the Raman laser is hysteretically responsive to the incident power of the pump optical beam in accordance with the teachings of the present invention. It is noted that the bistability could also occur at low pump power in an embodiment with the reflectivities of the reflectors defining the cavity being higher, resulting in larger cavity power enhancement, and the optical waveguide dimension being smaller in accordance with the teachings of the present invention. It is appreciated of course the dimensions, power values, dimensions, etc., of the described embodiments are for explanation purposes and that other dimensions, power values, dimensions, etc, may also be employed in accordance with the teachings of the present invention.

Figure 6:
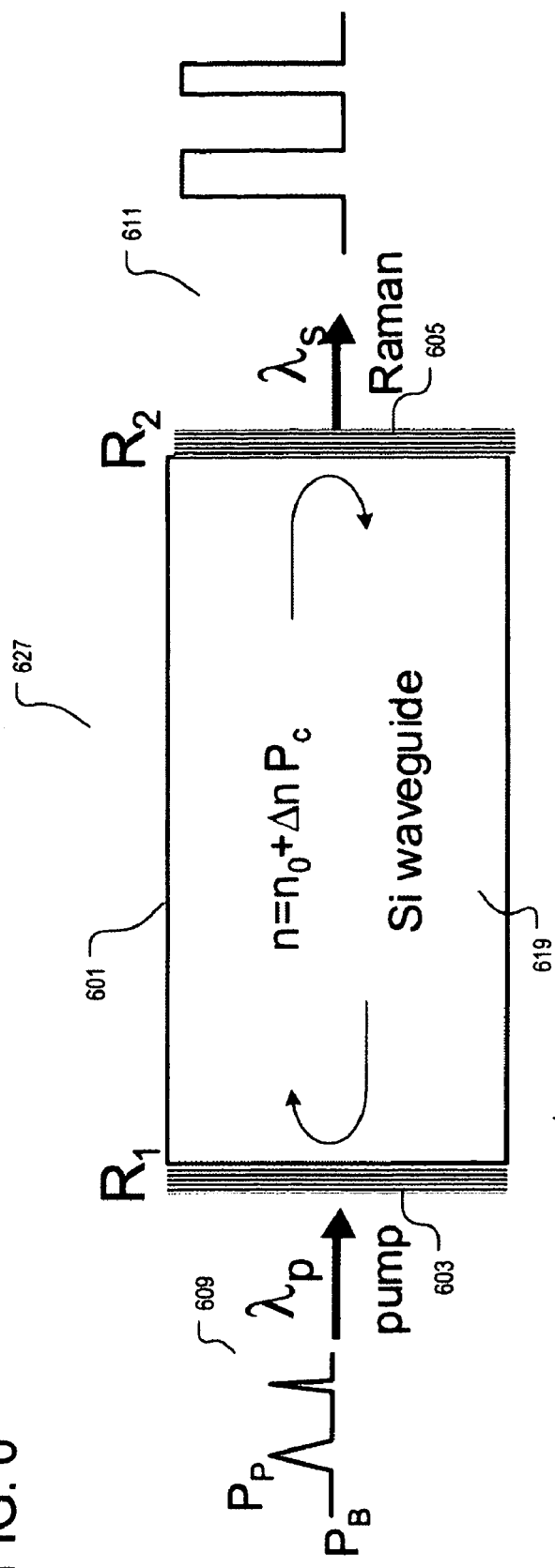
FIG. 6 is a block diagram illustrating one embodiment of a bistable silicon Raman laser reshaping an incident optical beam in accordance with the teachings of the present invention.
Figure 7:
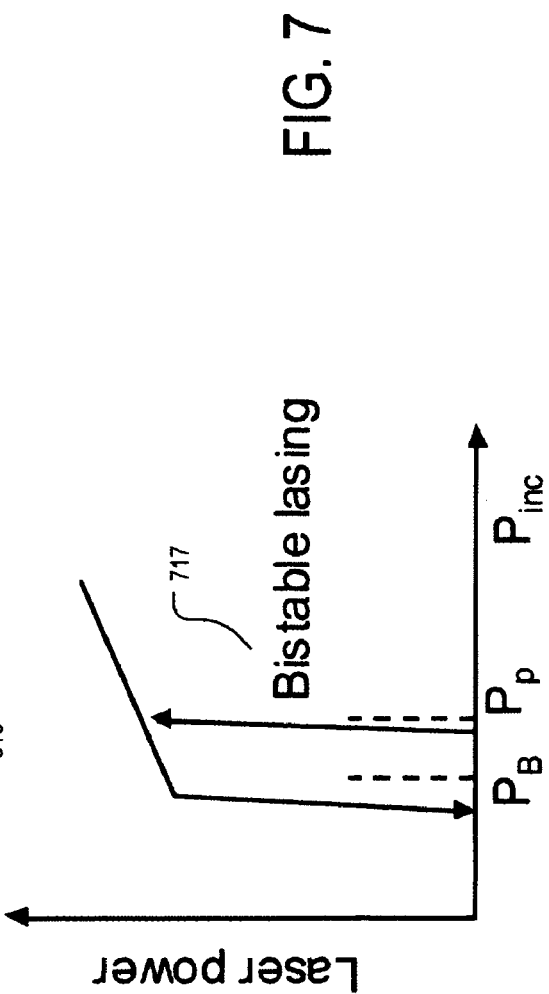
FIG. 7 is a diagram illustrating the relationship of the bistable lasing of an optical beam with respect to the optical power of an incident optical beam in accordance with the teachings of the present invention.

Directing attention now to FIGS. 6 and 7, the reamplification, regeneration, reshaping and/or wavelength conversion of optical beams are now described in accordance with the teachings of the present invention. To illustrate, FIG. 6 is a block diagram illustrating one embodiment of a bistable silicon Raman laser reshaping an incident optical beam and FIG. 7 is a diagram illustrating the relationship of the bistable lasing of an optical beam with respect to the optical power of an incident optical beam in accordance with the teachings of the present invention. As shown in FIG. 6, an optical waveguide is illustrated including reflectors 603 and 605, which define cavity 619. Reflectors 603 and 605 have reflectivities of $R_1$ and $R_2$ and reflect wavelengths $\lambda_P$ and $\lambda_S$. A pump optical beam 609 having a wavelength $\lambda_P$ is incident or directed into cavity 619 and a Raman optical beam 611 having a wavelength $\lambda_S$ is hysteretically emitted from cavity 619 in response to the power of optical beam 609 in accordance with the teachings of the present invention.

As shown in the depicted embodiment, a signal is encoded with pulses in the optical beam 609 resulting in optical beam 609 ranging in optical power values between a range of at least $P_B$ and $P_P$. As can be observed in FIG. 6, the signal on optical beam 609 is degraded such that the rising and falling edges of the signal are not necessarily clearly defined. In the illustrated embodiment, the incident signal in optical beam 609 contains pulses with a peak power of $P_P$ and a background power of $P_B$. As shown in FIG. 7, the bistable lasing 717 occurring in cavity 619 is selected such that lasing occurs when the power of the incident optical beam 609 rises at the pulse peak to $P_P$. No lasing occurs away from the pulse peak $P_P$ when the power of the incident optical beam 609 falls to $P_B$. Therefore, the laser output pulse shape of optical beam 611 having wavelength $\lambda_S$ is determined by the bistable laser hysteresis shape of bistable lasing region 717 in accordance with the teachings of the present invention.

In one embodiment, as the lasing output of optical beam 611 increases rapidly above the threshold, the digital signal encoded in laser pulse optical beam 611 has a higher extinction ratio as compared to the signal encoded in the incident optical beam 609 in accordance with the teachings of the present invention. In addition, signal regeneration and reshaping also occur using a bistable silicon Raman laser 627 in accordance with the teachings of the present invention. Furthermore, the laser wavelength $\lambda_S$ is shifted in one embodiment by 15.6 THz due to the Stokes shift in the Raman scattering of silicon. Thus, the incident pump signal is converted into a new wavelength in accordance with the teachings of the present invention.

Figure 8:
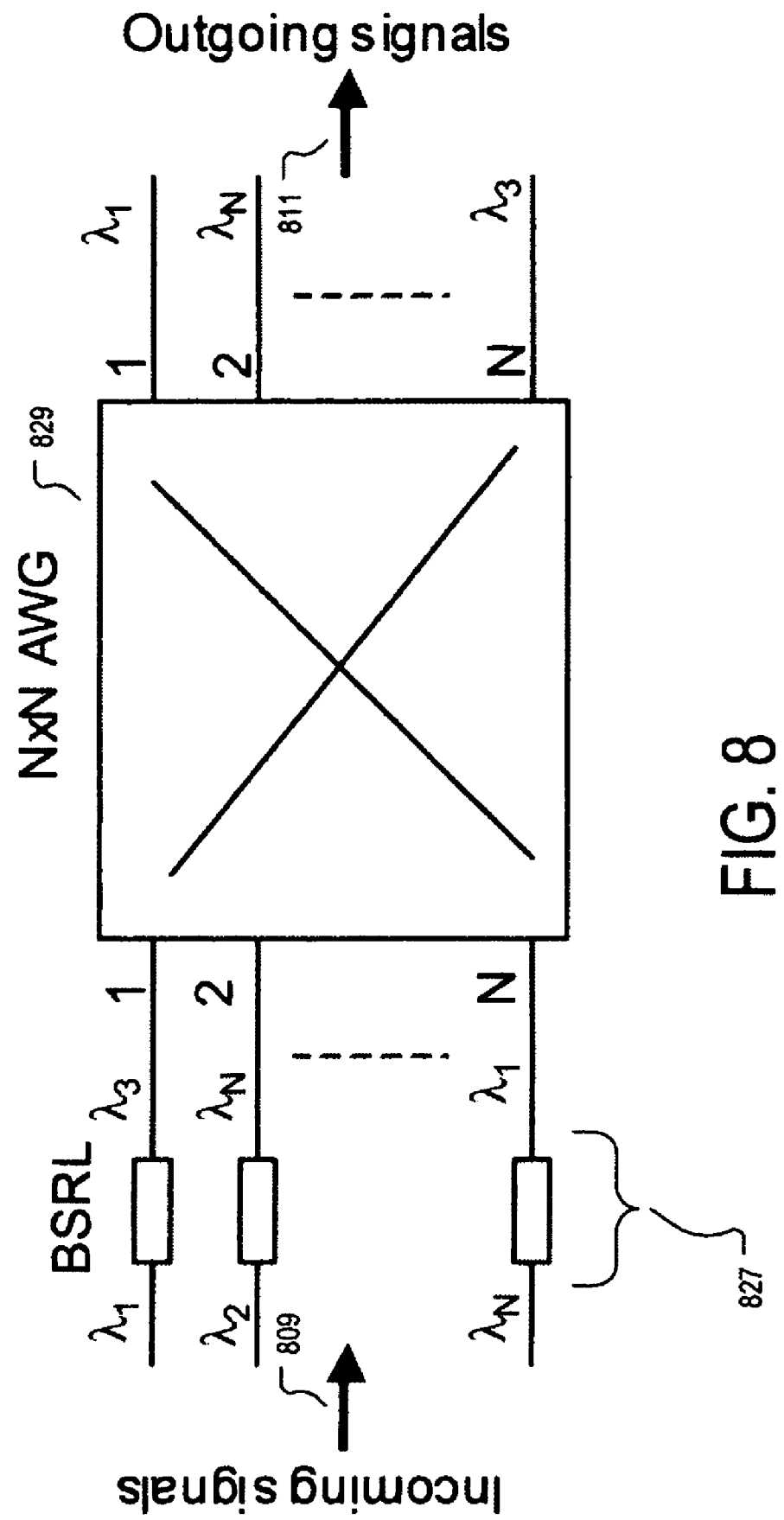
FIG. 8 is a block diagram illustrating one embodiment of an architecture of an optical switching fabric including embodiments of bistable silicon Raman lasers and an arrayed waveguide grating in accordance with the teachings of the present invention.

FIG. 8 is a block diagram illustrating one embodiment of an architecture of an optical switching fabric including embodiments of bistable silicon Raman lasers and an arrayed waveguide grating in accordance with the teachings of the present invention. In particular, FIG. 8 shows schematically the architecture of the optical switching fabric using wavelength converters based on bistable silicon Raman lasers (BSRL) 827 and a N×N arrayed waveguide grating (AWG) 829. In the illustrated embodiment, BSRLs 827 are substantially similar to one or more of the previously described lasers such as for example laser 127, 327 or 627. In the illustrated embodiment, AWG 829 coupled to the outputs of BSRLs 827 and is used as a wavelength demultiplexer. Combining the wavelength conversion with the wavelength routing of the AWG 829, one can achieve optical switching of the incoming signals 809 with outgoing signals 811 in accordance with the teachings of the present invention.

To illustrate, incoming signals 809 are received by each one of the plurality of BSRLs 827. Each of the incoming signals 809 has a different wavelength $\lambda_1, \lambda_2 \ldots \lambda_N$. In one embodiment, BSRLs 827 reshape, regenerate and/or reamplify as well as wavelength convert the respective incident incoming signals, which are received at corresponding inputs of AWG 829 as shown in FIG. 8. In the illustrated embodiment, AWG 829 serves as an N×N wavelength demultiplexer such that each of the outgoing signals 811 is output at the corresponding one of the N outputs of AWG 829. Therefore, an optical switching fabric is realized with BSRLs 827 in accordance with the teachings of the present invention.

The above description of illustrated embodiments of the invention, including what is described in the Abstract, is not intended to be exhaustive or to be limitation to the precise forms disclosed. While specific embodiments of, and examples for, the invention are described herein for illustrative purposes, various equivalent modifications are possible, as those skilled in the relevant art will recognize. Indeed, it is appreciated that the specific wavelengths, dimensions, materials, times, voltages, power range values, etc., are provided for explanation purposes and that other values may also be employed in other embodiments in accordance with the teachings of the present invention.

These modifications can be made to embodiments of the invention in light of the above detailed description. The terms used in the following claims should not be construed to limit the invention to the specific embodiments disclosed in the specification and the claims. Rather, the scope is to be determined entirely by the following claims, which are to be construed in accordance with established doctrines of claim interpretation.

What is claimed is:

1. An apparatus, comprising:
    an optical waveguide disposed in semiconductor material;
    first and second reflectors disposed in the optical waveguide, the first and second reflectors defining a cavity in the optical waveguide, the cavity to receive a first optical beam having a first wavelength, wherein a second optical beam of a second wavelength is hysteretically emitted from the cavity in response to stimulated Raman scattering of the first optical beam in the cavity.

2. The apparatus of claim 1 wherein the first and second reflectors each reflect the first and second wavelengths such that the first and second optical beams circulate in the cavity between the first and second reflectors.

3. The apparatus of claim 2 wherein the circulation of first and second optical beams in the cavity induces refractive index change in the semiconductor material in the cavity.

4. The apparatus of claim 1 wherein the lasing of the second optical beam occurs in the cavity when a power level of the first optical beam received by the cavity rises above a second power level until the power level of the first optical beam received by the cavity falls below the first power level.

5. The apparatus of claim 1 wherein the semiconductor material comprises silicon.

6. The apparatus of claim 5 wherein the cavity defines a silicon bistable Raman laser.

7. The apparatus of claim 1 wherein the first and second reflectors comprise gratings defined in the optical waveguide to define the cavity.

8. The apparatus of claim 1 wherein the first and second reflectors comprise coatings disposed at opposite ends of the cavity on the optical waveguide to define the cavity.

9. A method, comprising:
  directing a first optical beam of a first wavelength into a cavity defined between first and second reflectors in an optical waveguide disposed in semiconductor material; and
  hysteretically emitting a second optical beam of a second wavelength from the cavity in response to stimulated Raman scattering of the first optical beam in the cavity.

10. The method of claim 9 further comprising circulating the first and second optical beams having the first and second wavelengths in the cavity between the first and second reflectors.

11. The method of claim 10 further comprising changing an optical power in the cavity in response to the circulation of the first and second optical wavelengths of the first and second optical beams in the cavity.

12. The method of claim 10 further comprising changing a refractive index of the semiconductor material in the cavity in response to the circulation of the first and second optical wavelengths of the first and second optical beams in the cavity.

13. The method of claim 10 further comprising phase shifting the first and second optical beams in the cavity in response to the circulation of the first and second optical wavelengths of the first and second optical beams in the cavity.

14. The method of claim 10 further comprising varying optical power in the cavity in response to the phase shifting the first and second optical beams in the cavity.

15. The method of claim 9 further comprising reshaping a signal encoded on the first optical beam at the first wavelength into a digital signal encoded on the second optical beam at the second wavelength.

16. The method of claim 9 further comprising regenerating a signal encoded on the first optical beam at the first wavelength as a digital signal encoded on the second optical beam at the second wavelength.

17. The method of claim 9 further comprising wavelength convening a signal encoded on the first optical beam at the first wavelength into a digital signal encoded on the second optical beam at the second wavelength.

18. A system, comprising:
  an optical source to generate a first optical beam at a first wavelength having a signal encoded thereon;
  an optical waveguide disposed in semiconductor material;
  first and second reflectors disposed in the optical waveguide, the first and second reflectors defining a cavity in the optical waveguide, the cavity to receive the first optical beam, wherein a second optical beam having a second optical wavelength is hysteretically emitted from the cavity in response a power level of the signal encoded on first optical beam received by the cavity resulting from stimulated Raman scattering of the first optical beam in the cavity; and
  an optical fiber optically coupled to receive the second optical beam from the cavity to direct the second optical beam to an optical receiver.

19. The system of claim 18 wherein the power level of the signal encoded on the first optical beam received by the cavity rising above a second power level results in the emission of the second optical beam of the second wavelength from the cavity until the power level of the signal encoded on the first optical beam received by the cavity falls below a first power level, wherein the first power level is less than the second power level.

20. The system of claim 18 further comprising an arrayed waveguide grating optically coupled to receive the second optical beam, wherein the second optical beam received from the optical waveguide is one of a plurality of optical beams received by the arrayed waveguide grating, wherein the arrayed waveguide grating includes a plurality of outputs.

21. The system of claim 20 wherein each one of the plurality of inputs of the arrayed waveguide grating is optically coupled to receive a different wavelength such that each one of the plurality of outputs of the arrayed waveguide grating outputs a corresponding one of the different wavelengths received by the plurality of inputs of the arrayed waveguide grating, wherein the optical fiber is optically coupled to one of the plurality of outputs of the arrayed waveguide grating to direct the second optical beam to the optical receiver.

* * * * *

UNITED STATES PATENT AND TRADEMARK OFFICE
CERTIFICATE OF CORRECTION

| | | |
|---|---|---|
| PATENT NO. | : 7,508,576 B2 | Page 1 of 1 |
| APPLICATION NO. | : 11/040238 | |
| DATED | : March 24, 2009 | |
| INVENTOR(S) | : Liu et al. | |

It is certified that error appears in the above-identified patent and that said Letters Patent is hereby corrected as shown below:

In column 8, at line 6 delete, "convening" and insert --converting--.

Signed and Sealed this

Seventh Day of September, 2010

David J. Kappos
*Director of the United States Patent and Trademark Office*